United States Patent
Fujiwara et al.

(10) Patent No.: US 6,257,328 B1
(45) Date of Patent: Jul. 10, 2001

(54) THERMAL CONDUCTIVE UNIT AND THERMAL CONNECTION STRUCTURE USING THE SAME

(75) Inventors: Norio Fujiwara, Hirakata; Yasuhiro Akiba, Katano; Tetsuyuki Watanabe, Osaka; Naomi Nishiki, Kyoto, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/319,774

(22) PCT Filed: Oct. 12, 1998

(86) PCT No.: PCT/JP98/04568

§ 371 Date: Jun. 11, 1999

§ 102(e) Date: Jun. 11, 1999

(87) PCT Pub. No.: WO99/19908

PCT Pub. Date: Apr. 22, 1999

(30) Foreign Application Priority Data

Oct. 14, 1997 (JP) .................................................. 9-280134

(51) Int. Cl.$^7$ ........................................................ F28F 7/00
(52) U.S. Cl. ............................................... 165/185; 165/46
(58) Field of Search ........................... 165/104.33, 185, 165/46 HP; 361/700, 687; 257/715

(56) References Cited

U.S. PATENT DOCUMENTS

| | | | | |
|---|---|---|---|---|
| 640,534 | * | 1/1900 | Cheney ................................. | 165/46 |
| 4,602,678 | * | 7/1986 | Fick ..................................... | 165/185 |
| 4,849,858 | * | 7/1989 | Grapes et al. ........................ | 165/185 |
| 4,878,152 | * | 10/1989 | Sauzade et al. ..................... | 165/185 |
| 4,963,414 | * | 10/1990 | LeVasseur et al. .................. | 428/195 |
| 5,000,256 | * | 3/1991 | Tousignant ...................... | 165/104.33 |
| 5,095,404 | * | 3/1992 | Chao .................................... | 361/700 |
| 5,195,021 | * | 3/1993 | Ozmat et al. ........................ | 361/720 |
| 5,255,738 | * | 10/1993 | Przilas ................................. | 165/185 |
| 5,343,940 | * | 9/1994 | Jean ...................................... | 165/46 |
| 5,542,471 | * | 8/1996 | Dickinson ........................... | 165/185 |
| 5,560,423 | * | 10/1996 | Larson et al. ........................ | 361/700 |
| 5,769,158 | * | 6/1998 | Yao ..................................... | 165/185 |
| 5,902,762 | * | 5/1999 | Mercuri et al. ........................ | 501/99 |
| 5,958,572 | * | 9/1999 | Schmidt et al. ................... | 428/320.2 |
| 6,011,216 | * | 1/2000 | Kitahara et al. ..................... | 165/80.3 |

FOREIGN PATENT DOCUMENTS

| | | | |
|---|---|---|---|
| 197 04 549 | * | 2/1996 | (DE) . |
| 0651603 | * | 9/1994 | (EP) . |
| 3-104262 | | 5/1991 | (JP) . |
| 8-23183 | | 1/1996 | (JP) . |
| 8-267647 | | 10/1996 | (JP) . |
| 9-55456 | | 2/1997 | (JP) . |
| 09055456 | * | 2/1997 | (JP) . |
| 9-156913 | | 6/1997 | (JP) . |

* cited by examiner

Primary Examiner—Ira S. Lazarus
Assistant Examiner—Zho Van Duong
(74) Attorney, Agent, or Firm—Wenderoth, Lind & Ponack, L.L.P.

(57) ABSTRACT

In a heat conducting unit, a heat conducting member composed of a material with good heat conductivity shaped in correspondence with the shape of a heat path is contained in a container made of a flexible sheet having a given thickness. The heat conducting member contained in the container connects at least two parts at different temperatures to form the heat path for efficiently transferring heat generated in a higher-temperature part to a lower-temperature part. Heat is dissipated away from the lower-temperature part through the heat path to cool the higher-temperature part.

1 Claim, 14 Drawing Sheets

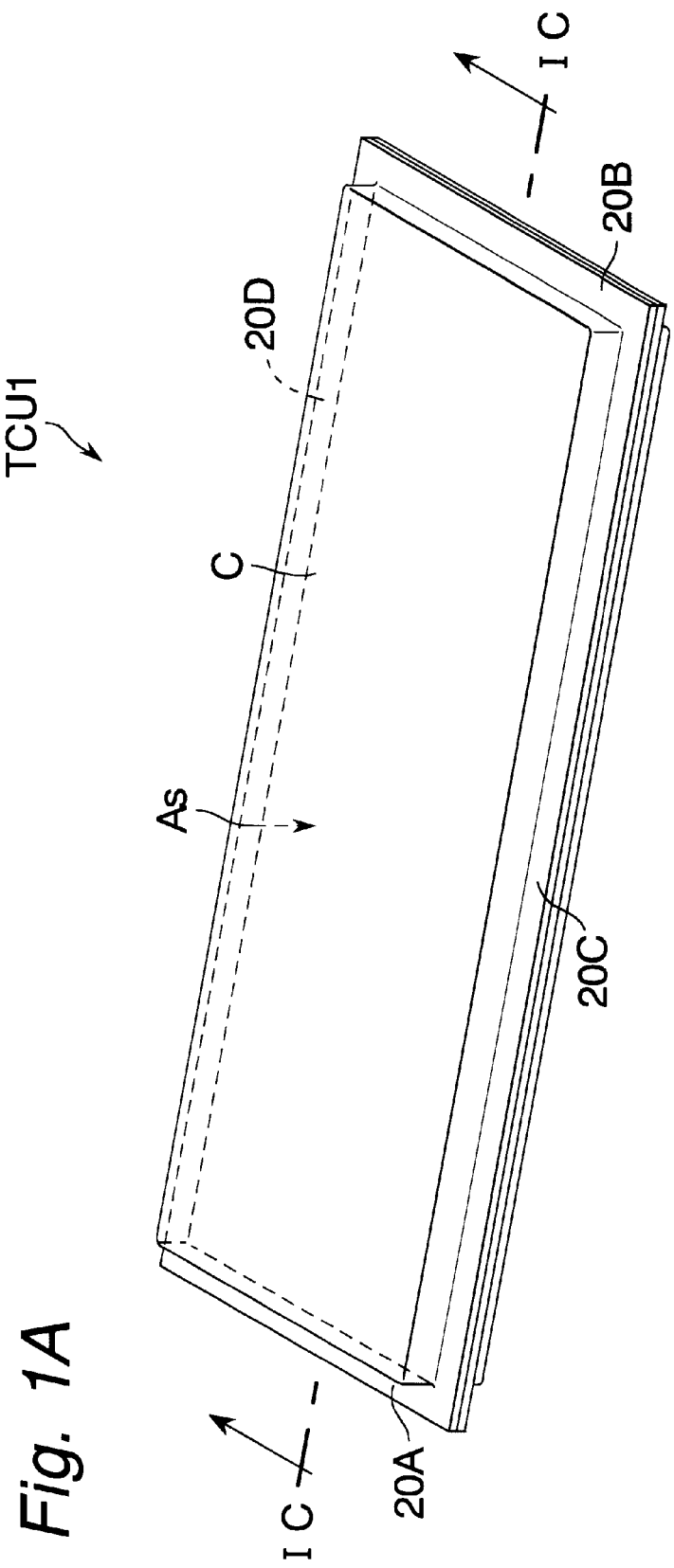

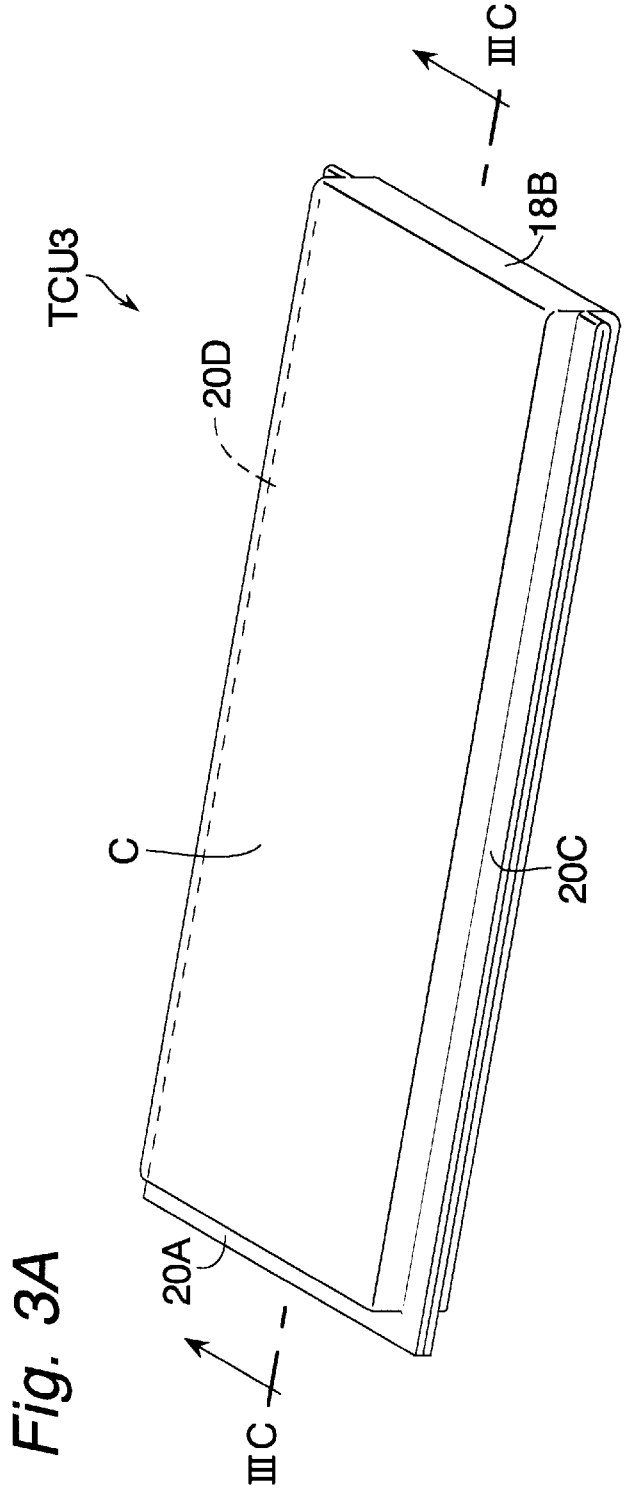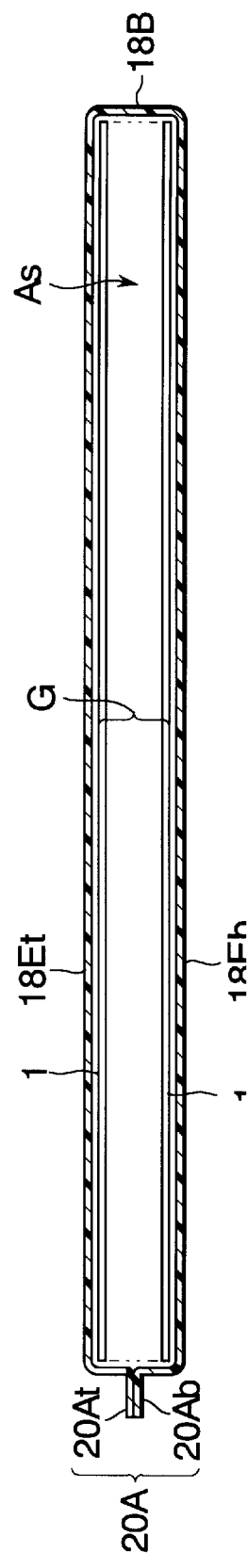

THERMAL CONDUCTIVE UNIT AND THERMAL CONNECTION STRUCTURE USING THE SAME

TECHNICAL FIELD

The present invention relates to heat conducting units designed to remove internally generated heat from electronic equipments which are very highly integrated for size and weight reduction, such as notebook-sized personal computers, and portable information terminals. A heat path is formed by connecting parts at different temperatures in an electronic device so that heat generated in a hotter part can be efficiently transferred to a cooler part. More specifically, the present invention relates to a heat conducting unit for instantaneously transferring heat generated in a part at high temperature so that the heat will not be conducted around, and a heat connecting structure using the heat conducting unit.

BACKGROUND ART

In electronic equipments formed of electronic components, heat generated inside must be removed away to cool the interior of the electronic equipments so as to prevent malfunction of the electronic components due to heat. For this purpose, conventionally, air cooling system are widely adopted to cool electronic components, in which a fan is installed inside an electronic device to produce internal air flow to transfer heat generated in a higher-temperature part to a lower-temperature part or to remove heat to outside.

However, such electronic devices as notebook-sized personal computers, and portable information terminals, are constructed to very high degrees of integration for power consumption, reduction, and size and weight reduction. In such highly integrated electronic devices, a space enough to accommodate a fan cannot be ensured to form a heat path for air flow. Hence, instead of the air cooling system in which air flow is caused in a heat path, such devices adopt the heat conducting cooling system in which components in a notebook-sized personal computer are connected to a heat dissipating part through a heat conducting member to transfer heat from a hotter part to the heat dissipating part and discharge heat to the outside.

In this heat conducting cooling system, for example, in order to dissipate heat generated in a CPU from a radiation board, a radiation board made of aluminum is bonded to the CPU with a highly heat conducting adhesive, or a radiation board is pressed against the CPU over a radiation sheet made of a conducting material such as silicone polymer, so as to conduct the heat from the CPU to the radiation board where it is dissipated. In another method, the metal plate of aluminum on the back of the key board is used for a radiation board and the heat is dissipated from the metal plate through a radiation sheet made of silicone polymer.

As stated above, when dissipating heat from a radiation board by thermal conduction, the heat dissipating capability of the radiation board must be increased depending on how much heat would be dissipated. Generally, increasing the heat dissipating capability requires a larger heat dissipating area of the radiation board. However, in most cases, electronic components are fixed in predetermined positions, and therefore the radiation board will interfere with the electronic components if it is simply enlarged to ensure the dissipating area. Then the radiation board must be formed in a complicated shape to avoid interference with the electronic components. Further, in many cases, one unit of radiation board has to be made of two or more radiation parts when it cannot be made of a single radiation part.

In such cases, two radiation parts forming a radiation board are provided, as an integrated radiation board, with a radiation sheet made of silicone polymer etc. interposed between them, or with screws fastening the two radiation parts. If a large number of radiation parts exist in the heat dissipating path connecting a heat generating part and a heat dissipating part, some of the radiation parts may provide lower thermal conductivity, or connective thermal resistance may be developed between the radiation parts, and then the heat resistance of the entire heat dissipating path increases to decrease the heat dissipating capability. If a larger radiation board is used to solve these problems, this will cause a vicious circle of increasing the weight of the electronic equipment. Moreover, when the heat resistance of the entire heat dissipating path is increased, then the heat generated in the heat generating part will be conducted to the surrounding electronic components before dissipated through the heat dissipating path and will exert thermal effects on the electronic components.

When a radiation board made of an aluminum material with poor flexibility is directly attached to a main component such as a CPU or an HDD, vibrations occurring inside and outside of the electronic equipment will be transferred to the CPU or the HDD through the radiation board to damage it.

Further, a radiation board made of metal like copper having superior thermal conductivity to aluminum is heavier. Even for an aluminum radiation board, its weight cannot be neglected from the viewpoint of size and weight reduction. In portable information processors, etc., lighter heat conducting units with efficient heat conductivity are demanded so as to reduce size and weight of main devices.

It is widely known that graphite is most suitable as such a material that can efficiently conduct heat. However, it is very difficult to form graphite into a desired shape; even if a desired shape can be achieved, it is further difficult to ensure strength enough to maintain the shape. In this way, heat conducting units which can keep a fragile material with good heat conductivity like graphite in a desired shape are required for use to form a heat conducting path in a desired shape.

DISCLOSURE OF THE INVENTION

The present invention provides a heat conducting unit light in weight with efficient heat conductivity, thereby enabling size reduction and weight reduction of the main device.

According to a first aspect of the present invention, a heat conducting unit connecting at least two parts at different temperatures to form a heat path for efficiently transferring heat generated in a higher-temperature part to a lower-temperature part comprises:

a heat conducting member composed of a material with good heat conductivity shaped in accordance with the shape of the heat path; and a container composed of a flexible sheet having a given thickness, for containing the heat conducting member, wherein the heat conducting unit is thermally connected to the higher-temperature part and lower-temperature part through the flexible sheet.

As stated above, according to the first aspect of the present invention, a material with good heat conductivity is thermally connected to a higher-temperature part and a lower-temperature part through a flexible sheet made of a flexible high-molecular compound to form a heat path, and heat in the higher-temperature part is transferred to the lower-temperature part through the heat path to effectively cool the higher-temperature part.

According to a second aspect of the present invention, in the first aspect, the material with good heat conductivity has thermal conductivity of 100 W/mk or higher.

As stated above, according to the second aspect of the present invention, the heat path can be formed with an appropriate material selected from heat conducting materials each having conductivity of 100 W/mk or higher.

According to a third aspect of the present invention, in the second aspect, the material with good heat conductivity has thermal conductivity of 1,004 W/mk or lower.

As stated above, according to the third aspect of the present invention, the heat path can be formed with an appropriate material selected from heat conducting materials each having conductivity of 100 W/mk or higher and 1,004 W/mk or lower.

According to a fourth aspect of the present invention, in the third aspect, the heat conducting member is composed of the material with good heat conductivity formed in a sheet-like shape having a given thickness.

As stated above, according to the fourth aspect of the present invention, the thermal conducting member is formed in a sheet-like shape, so that the heat path can be formed even in a smaller space.

According to a fifth aspect of the present invention, in the third aspect, the material with good heat conductivity is composed of graphite.

As stated above, according to the fifth aspect of the present invention, a graphite sheet having high heat conductivity but lower mechanical strength such as a tensile strength and a peeling strength is covered by a flexible sheet, which reinforces the mechanical strength of the graphite sheet and realizes a heat conducting unit having reduced weight and high thermal conductivity and facilitating assembly.

According to a sixth aspect of the present invention, in the fifth aspect, the heat conducting member composed of graphite and formed in the sheet-like shape has flexibility.

As stated above, according to the sixth aspect of the present invention, the sheet-like graphite has flexibility and therefore absorbs vibration, so that it can be kept in direct contact with a heat generator which may be broken by vibration to conduct heat more efficiently.

According to a seventh aspect of the present invention, in the sixth aspect, the given thickness of the heat conducting material composed of graphite and formed in the sheet-like shape is not smaller than 10 $\mu$m nor larger than 800 $\mu$m.

As stated above, according to the seventh aspect of the present invention, setting the thickness of the graphite sheet to 10 $\mu$m or larger and 800 $\mu$m or smaller gives desirable flexibility to the graphite sheet.

According to an eighth aspect of the present invention, in the seventh aspect, the material with good heat conductivity has a specific gravity of not smaller than 0.5 nor larger than 2.25.

As stated above, according to the eighth aspect of the present invention, setting the specific gravity of the graphite sheet to 0.5 or larger and 2.25 or smaller gives desirable flexibility to the graphite sheet.

According to a ninth aspect of the present invention, in the fourth aspect, the heat conducting member is constructed by stacking a plurality of heat conducting members formed in the sheet-like shape.

As stated above, according to the ninth aspect of the present invention, a heat conducting unit having a desired thickness can be obtained by stacking heat conducting members formed in a sheet-like shape.

According to a tenth aspect of the present invention, in the ninth aspect, the heat conducting member formed in a stacked sheet is transformed into a desired shape.

As stated above, according to the tenth aspect of the present invention, a heat path in a desired shape can be formed by transforming the sheet-shaped heat conducting member into the desired shape.

According to an eleventh aspect of the present invention, in the tenth aspect, the respective heat conducting members formed in the sheet-like shape and transformed in the desired shape are bonded to each other.

As stated above, according to the eleventh aspect of the present invention, the entire shape of the heat conducting members can be stabilized by bonding the sheet-like heat conducting members transformed into a desired shape.

According to a twelfth aspect of the present invention, in the fourth aspect, the heat conducting member is formed in a desired shape in accordance with the shape of the heat path.

As stated above, according to the twelfth aspect of the present invention, a heat conducting unit can be realized in a shape fitting for the heat path.

According to a thirteenth aspect of the present invention, in the fourth aspect, the container is bonded to the heat conducting member contained therein.

As stated above, according to the thirteenth aspect of the present invention, the shape of the contained heat conducting member can protectively be stabilized.

According to the fourteenth aspect of the present invention, in the eleventh aspect, the container is bonded to the heat conducting member contained therein.

As stated above, according to the fourteenth aspect of the present invention, the entire shape of the plurality of heat conducting members contained and bonded to each other can be protectively stabilized.

According to a fifteenth aspect of the present invention, in the twelfth aspect, the container is bonded to the heat conducting member contained therein.

As stated above, according to the fifteenth aspect of the present invention, the shape of the heat conducting member contained and formed in a desired shape can be protectively stabilized.

According to a sixteenth aspect of the present invention, in the first aspect, the flexible sheet is composed of a high-molecular compound.

As stated above, according to the sixteenth aspect of the present invention, the shape of the heat conducting member contained and formed in accordance with a desired shape can protectively be stabilized.

According to a seventeenth aspect of the present invention, in the sixteenth aspect, the given thickness of the flexible sheet is not smaller than 1 $\mu$m nor larger than 300 $\mu$m.

As stated above, according to the seventeenth aspect of the present invention, setting the thickness of the sheet-like high-molecular compound to 1 $\mu$m or larger and 300 $\mu$m or smaller prevents the trouble of deteriorating the thermal conductivity of the entire heat conducting unit due to excessive thermal resistance of the sheet-like high-molecular compound.

According to an eighteenth aspect of the present invention, in the seventeenth aspect, the flexible sheet has a tensile strength of 2 kg/mm$^2$ or higher and a shearing strength of 2 kg/mm$^2$ or higher.

As stated above, according to the eighteenth aspect of the present invention, the sheet-like high-molecular compound has the mechanical strength such as a tensile strength of 2 kg/mm² or higher and a shearing strength of 2 kg/mm² or higher, and then the heat conducting member contained therein can be safely protected without deteriorating the thermal conductivity of the entire heat conducting unit.

According to a nineteenth aspect of the present invention, in the first aspect, the high-molecular compound is selected from the group consisting of polyester, polyamide, polyvinyl chloride, and polypropylene.

As stated above, according to the nineteenth aspect of the present invention, the container can be manufactured at low cost by using a common high-molecular compound.

According to a twentieth aspect of the present invention, in the nineteenth aspect, the high-molecular compound is polyester having the given thickness of 20 to 30 μm.

As stated above, according to the twentieth aspect of the present invention, polyester is selected for the high-molecular compound, and the thickness can be reduced without deteriorating required mechanical strength to ensure thermal conductivity of the entire heat conducting unit.

According to a twenty-first aspect of the present invention, in the first aspect, a rim is formed around the container to strengthen the container.

As stated above, according to the twenty-first aspect of the present invention, the rim formed around the container reinforces the mechanical strength of the container and also prevents direct application of external force to the side wall of the container.

According to a twenty-second aspect of the present invention, in the first aspect, the heat conducting unit is sandwiched between two opposing plates including at least one heat conductor and is thermally connected to the plate of the heat conductor.

As stated above, according to the twenty-second aspect of the present invention, the heat conducting unit is sandwiched between two plates, at least one of which is a heat conductor, to make the thermal connection, thus the heat conducting unit is provided with efficient heat conductivity and is easier to assemble.

According to a twenty-third aspect of the present invention, in the twenty-second aspect, the heat conducting unit is pressurized by the opposing two plates to make the thermal connection.

As stated above, according to the twenty-third aspect of the present invention, the heat conducting unit is pressurized by the opposing two plates and is thermally connected, which keeps the individual heat conducting members, the heat conducting members and high-molecular compound sheet, and the high-molecular compound sheet and heat conducting members in closer contact and improves the heat conductivity.

According to a twenty-fourth aspect of the present invention, in the twenty-third aspect, one of the opposing two plates is selected from the group consisting of a rubber sheet and a sol foamed soft sheet.

As stated above, according to the twenty-fourth aspect of the present invention, the heat conducting unit is elastically pressed by a rubber sheet or a sol foamed sheet to make thermal connection, which keeps the individual heat conducting members, the heat conducting members and high-molecular compound sheet, and the high-molecular compound sheet and heat conducting members in closer contact and improves the heat conductivity.

According to a twenty-fifth aspect of the present invention, in the twenty-third aspect, one of the opposing two plates is selected from the group consisting of an adhesive tape and a heat-shrinkable tube.

As stated above, according to the twenty-fifth aspect of the present invention, since the thermal connection is made with a simple structure in which one of the opposing two plates is an adhesive tape or a heat-shrinkable tube, it is possible to keep the individual heat conducting members, the heat conducting members and high-molecular compound sheet, and the high-molecular compound sheet and heat conducting members in closer contact to improve the heat conductivity at low cost.

According to a twenty-sixth aspect of the present invention, in the twenty-third aspect, one of the opposing two plates is a resin frame of an electronic apparatus.

As stated above, according to the twenty-sixth aspect of the present invention, since one of the opposing two plates is a resin frame of an electronic apparatus, the number of parts of the heat connecting structure can be reduced to reduce cost and to facilitate the assembly.

According to a twenty-seventh aspect of the present invention, in the twenty-second aspect, at least one of the heat conductors is a heat radiation part.

As stated above, according to the twenty-seventh aspect of the present invention, one of the opposing two plates is a heat radiation part, so that the number of parts can be reduced to reduce the weight and cost.

BRIEF DESCRIPTION OF THE DRAWINGS

FIG. 1A is a perspective view showing a heat conducting unit of a first embodiment of the present invention, FIG. 3A is a perspective view showing a heat conducting unit of a third embodiment of the present invention, FIG. 3C shows the section IIIC—IIIC of the heat conducting unit shown in FIG. 3A.

BEST MODE FOR CARRYING OUT THE INVENTION

The present invention will be described in more detail referring to the accompanying drawings.
(First Embodiment)

Now referring to FIG. 1A, FIG. 1B, FIG. 1C, and FIG. 1D, a heat conducting unit according to a first embodiment of the present invention will be described.

As shown in the perspective view of FIG. 1A, the heat conducting unit TCU1 of this embodiment has a container C extending in one direction to form an approximately rectangular space As inside and rim sections 20A, 20B, 20C and 20D integrally extending approximately in the center of the side wall of the container C. The rim section 20A and the rim section 20B are formed on the opposite sides perpendicular to the elongate direction of the container C and the rim section 20C and the rim section 20D are formed on the opposite sides parallel to the elongate direction of the container C.

Figure 1B:
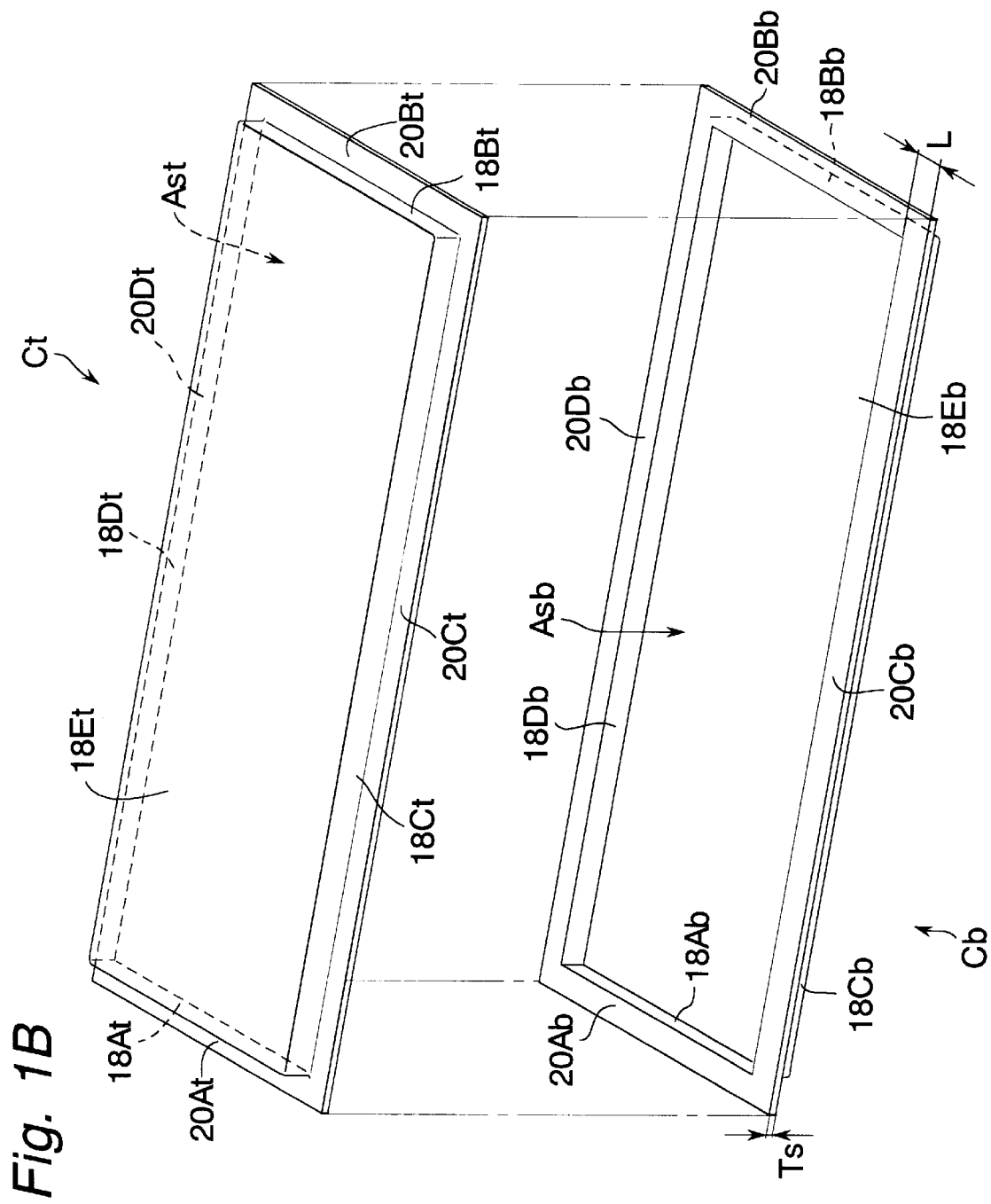
FIG. 1B is an exploded view showing the structure of the container of the heat conducting unit shown in FIG. 1A.

As shown in the developed view of FIG. 1B, the container C has a first case Cb and a second case Ct. A recessed part Asb is formed in the first case Cb configured in a square pillar shape by four side walls 18A$b$, 18B$b$, 18C$b$, and 18D$b$ and a bottom wall 18E$b$. The rims 20A$b$, 20B$b$, 20C$b$ and 20D$b$ extend in a given length L from the edge of the opening of the first case Cb approximately in parallel with the bottom wall 18E$b$. Preferably, the side walls 18A$b$, 18B$b$, 18C$b$, 18D$b$, the bottom wall 18E$b$, and the rims 20A$b$, 20B$b$, 20C$b$, 20D$b$ are made of a sheet material composed of a high-molecular compound having a given thickness Ts.

The second case Ct is in substantially the same shape as the first case Cb. That is to say, a recessed part Ast is formed in the second case Ct configured in a square pillar shape by four side walls 18A$t$, 18B$t$, 18C$t$, and 18D$t$ and a top wall 18E$t$. The rims 20A$t$, 20B$t$, 20C$t$ and 20D$t$ extend in a given length L from the edge of the opening of the second case Ct approximately in parallel with the top wall 18E$t$. Preferably, the side walls 18A$t$, 18B$t$, 18C$t$, 18D$t$, the top wall 18E$t$, and the rims 20A$t$, 20B$t$, 20C$t$, 20D$t$ are made of a sheet material composed of a high-molecular compound having the given thickness Ts.

As shown in FIG. 1B, the first and second cases thus constructed are arranged with their respective openings facing each other, and the opposing rims 20A$b$ and 20A$t$, 20B$b$ and 20B$t$, 20C$b$ and 20C$t$, and 20D$b$ and 20D$t$ are joined together to form the container C having the space As formed of the recessed part Asb and the recessed part Ast. The rims 20A$b$ and 20A$t$, 20B$b$ and 20B$t$, 20C$b$ and 20C$t$, and 20D$b$ and 20D$t$ are joined together to form the rim sections 20A, 20B, 20C and 20D. The rim section 20 may be joined with an adhesive agent, or may be thermally welded when the high-molecular compound sheet material has thermoplasticity. The formation of the rim section 20 around the container C prevents direct application of force to the container C from around, and also strengthen the entirety of the heat conducting unit TCU.

Figure 1C:
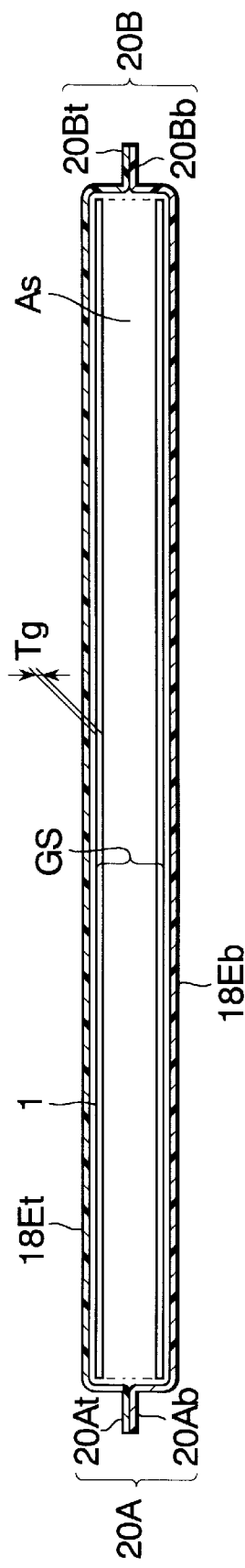
FIG. 1C shows the section IC—IC of the heat conducting unit shown in FIG. 1A.

FIG. 1C shows the section IC—IC of the heat conducting unit TCU1 shown in FIG. 1A. As shown in this diagram, a graphite sheet group GS including a given number of stacked flexible graphite sheets 1 is contained in the space As of the container C. Preferably, all of the graphite sheets 1 forming the graphite sheet group GS are substantially in the same shape. However, using the graphite sheets 1 formed in different shapes is also effective depending on the application of the heat conducting unit TCU1.

Figure 1D:
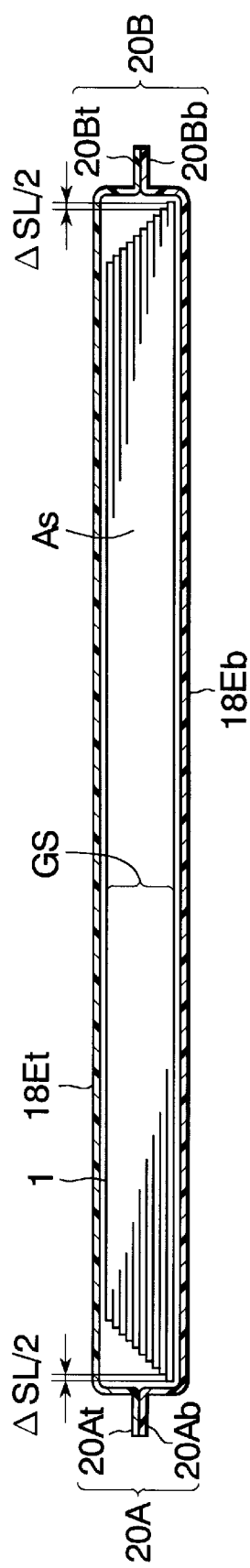
FIG. 1D is a sectional view showing an example of modification of the heat conducting unit shown in FIG. 1C.

FIG. 1D shows an example of the graphite sheet group GS composed of graphite sheets 1 having different lengths. In this example, the graphite sheets 1 each differing in length by $\Delta$ SL are stacked in order, to form the graphite sheet group GS. A heat conducting unit TCU1 containing such a graphite sheet group GS composed of graphite sheets 1 of different lengths is suitable when the heat conducting unit TCU1 is used in a form bent in one direction, in which the difference in length, $\Delta$ SL, between the graphite sheets 1 can appropriately be determined in accordance with the thickness Tg of each graphite sheet 1, the number of the graphite sheets 1 forming the graphite sheet group GS, the thickness Ts of the high-molecular compound sheet of the container C, and the curvature of the bend of the heat conducting unit TCU. Such heat conducting units TCU1 formed by bending graphite sheets 1 will be described later referring to FIG. 4A, FIG. 4B, FIG. 4C and FIG. 5A, FIG. 5B, FIG. 5C.

As have been described referring to FIGS. 1A, 1B, 1C, and 1D, in the heat conducting unit TCU1 of this invention, a graphite sheet group GS containing graphite sheets 1 having excellent thermal conductivity but easy to break because of its inferior peeling strength is contained in a container C composed of a protect sheet of a high-molecular compound, which protects the graphite sheet group GS from stresses and impact force exerted from outside; the entire heat conducting unit TCU1 ensures strength enough to endure actual use for the graphite sheets 1 and the graphite sheet group GS. The graphite sheets 1 and the high-molecular compound of the container C must satisfy the following conditions to allow the heat conducting unit TCU1 to exert this performance.

While graphite sheets having useful properties such as excellent thermal resistance, chemical resistance are widely used for industrial material for gaskets, heat-resisting seal material, the graphite sheets 1 of the present invention can be produced by the following methods roughly classified into three groups.
Graphite Sheets First, in a first manufacturing method, film of a particular high-molecular compound is heat-treated at a temperature of 2400° C. or higher in an inert gas to form graphite structure, which is processed at high temperature to create foam condition and is rolled to produce graphite sheet having flexibility and elasticity (for example, refer to Japanese Patent Laying-Open No. 3-75211, Japanese Patent Laying-Open No. 8-23183, Japanese Patent Laying-Open No. 8-267647, and Japanese Patent Laying-Open No. 9-156913). Among the graphite sheets obtained by this manufacturing method, ones with specific gravity of 0.5 to 2.25 and thermal conductivity of 600 to 1,004 W/mk are suitable as the graphite sheets 1 of the present invention. The range of the specific gravity is set large because of differences among manufacturing methods; sheet materials with good flexibility have smaller specific gravity (0.5 to 1.5) and sheet materials with poor flexibility have larger specific gravity (1.5 to 2.3).

While the graphite sheets 1 have high thermal conductivity and excellent heat transferring property, the graphite sheets 1 need to have large cross-sectional sections to sufficiently conduct heat. For this, the thickness Tg of the graphite sheets 1 should be set large. However, if the thickness Tg of the graphite sheet is too large, then the graphite sheet will become very weak because of a reason in production, and it cannot provide sufficient flexibility. Accordingly the thickness Tg of the graphite sheet 1 is preferably not smaller than 10 µm nor larger than 800 µm. Preferably, the graphite sheets 1 used in the first embodiment have a thickness Ts of 100 µm, thermal conductivity of 600 to 1004 W/mk, and a specific gravity of 0.8 to 1.0.

In a second manufacturing method, natural graphite is treated with acid like sulfuric acid or nitric acid and then heated to obtain expanded graphite, and then it is roll-formed to obtain an expanded graphite sheet. While this expanded graphite sheet has flexibility and can be used for gaskets etc., its thermal conductivity is about 1/10 as compared with the graphite sheet obtained in the first manufacturing method, but it has the advantage of very low manufacture cost.

A third manufacturing method obtains a thin film of carbon formed by physical or chemical manufacturing technique such as a Union Carbide System, a Vacuum Deposition Method, a CVD (Chemical Deposition) Method, a Sputtering Method, an Ion Plating Method. The thin film of carbon thus obtained is characterized by its relatively high thermal conductivity.

Further, a graphite sheet or a carbon film formed by methods similar to the first method may be used. For use in the heat conducting unit TCU, graphite sheets manufactured by the first method are preferred, but, generally, ones with thermal conductivity of 100 W/mk or higher and specific gravity of 2.0 or smaller can be used as the graphite sheet 1 without practical problems.

When forming the graphite sheet group GS by stacking a plurality of graphite sheets 1 thus prepared, the graphite sheets 1 may be bonded to each other to fix the shape of the graphite sheet group GS. Adhesives such as epoxy adhesives, acrylate adhesives, or silicone adhesives may be used to bond the graphite sheets 1 to fix the shape of the graphite sheet group GS. Needless to say, adhesives with higher thermal conductivity are preferred.

Graphite Block

Instead of fixing the shape of the graphite sheet group GS by bonding the graphite sheets 1 together, graphite having no flexibility is shaped in a rod-like shape, and then is accommodated in the container C. Such rod-like graphite can be produced by applying pressure to carbon material such as coke heated to about 3,000 degrees. Also, pyrolytic graphite produced by bringing hydrocarbon into contact with substrate heated to high temperature may be used. Although not shown, the graphite block GB may be substituted for the graphite sheet group GS in FIG. 1.

High-Molecular Compound Sheet

The high-molecular compound sheet forming the container C and the rim section 20 of the heat conducting unit TCU1 is required to provide insulating property, chemical resistance, and weather resistance, since it is used in an electronic apparatus. Considering these conditions, the material of the high-molecular compound sheet is mainly selected from polyester, polyamide, polyvinyl chloride, polypropylene, etc.

While the high-molecular compound sheet protects the graphite sheet group GS or graphite block GB accommodated in the container C, it is important that the high-molecular compound sheet should not interfere with conduction of heat from a heat generating part to which the graphite sheet group GS or the graphite block GB is connected. Hence the high-molecular compound must satisfy both the contradicting requirements of mechanical strength and good thermal conductivity. That is to say, while mechanical strength of the high-molecular compound sheet can be ensured by enlarging the thickness Ts, it deteriorates thermal conductivity. Considering these contradicting requirements, the thickness Ts is preferably set as thin as possible on condition that the high-molecular compound sheet provides a tensile strength of 2 kg/mm$^2$ or higher and a shearing strength of 2 kg/mm$^2$ or higher as mechanical strength. While polyester with a thickness Ts of 20 to 30 micron is preferably used in this invention, other generally used materials as mentioned above may be used in place of polyester. However, note that the thickness Ts of the high-molecular compound sheet is preferably not less than 1 micron nor more than 300 micron in order to prevent reduction of thermal conductivity of the entire heat conducting unit TCU1.

In this embodiment, the graphite sheet group GS or graphite block GB is not bonded to the high-molecular compound sheet (the container C2). However, they may be bonded together, which is effective to fix shape of the graphite sheet group GS.

It is more preferred that the graphite sheet group GS or graphite block GB accommodated in the heat conducting unit TCU1 is not exposed from the container C. However, depending on the place of application of the heat conducting unit TCU1, that is, when there is no chance of short circuit, a hole of a given size may be formed in the bottom wall 18E*b* or top wall 18E*t* of the container C so that the graphite sheet group GS or graphite block GB can be in direct contact with a higher-temperature part, so as to ensure thermal conductivity of the entire heat conducting unit TCU1.

While FIGS. 1A, 1C, and 1D show the heat conducting unit TCU1 in a linear form, the graphite sheets 1, the container C, and the rim section 20 are all flexible. Accordingly the heat conducting units TCU1 of the present invention can freely be placed in an electronic apparatus. Further, graphite sheets 1 may be previously transformed to fit the shape of the space in which the heat conducting unit TCU1 is installed and then bonded to each other, which can be used as a thermal conducting unit TCU1 having the graphite sheet group GS with its entire shape fixed.

Moreover, since it is covered with a high-molecular sheet having high electric insulating property, it will not cause short circuit even if it erroneously comes in contact with wiring and circuit in the electronic apparatus. The advantages of the heat conducting unit TCU1 of this embodiment can be summarized as follows:

(1) High thermal conductivity.
(2) Facilitate assembly. (It can freely be shaped in the main device.)
(3) Flexible and absorb vibrations.
(4) Light in weight. (Graphite has specific gravity of 1.0 or smaller, while aluminum has specific gravity of 2.67.)
(5) As covered with an insulating high-molecular compound sheet (container C), it does not cause short-circuit even when it accidentally touches a wiring board.

In this way, the heat conducting unit TCU1 of the first embodiment of the present invention is characterized by covering a thing composed by stacking a sheet, or two or more sheet-like graphite, of graphite with a sheet-like high-molecular compound, thus providing a heat conducting unit which gives strength to graphite sheets having high thermal conductivity but inferior tensile strength and peeling strength. As a result, a heat conducting unit is realized to be light in weight, with high thermal conductivity, and convenience in assembly.

Further, the sheet-like graphite has a thickness Tg not smaller than 10 μm nor larger than 800 μm, and also has flexibility to absorb vibration. It can be in direct contact with a heat generator such as a CPU, an HDD. Which may be broken by vibration, thus further improving the heat conducting efficiency.

When the thickness Ts of the sheet-like high-molecular compound is set to 1 μm or larger and 300 μm or smaller, it is possible to avoid the problem that the thermal conductivity of the entirety of the heat conducting unit is deteriorated due to excessive thermal resistance of the sheet-like high-molecular compound.

A sheet-like graphite is processed into a given shape and then covered in a sheet-like high-molecular compound along the shape; it can be easily installed in the main device because it is in the given shape.

(Second Embodiment)

Figure 2A:
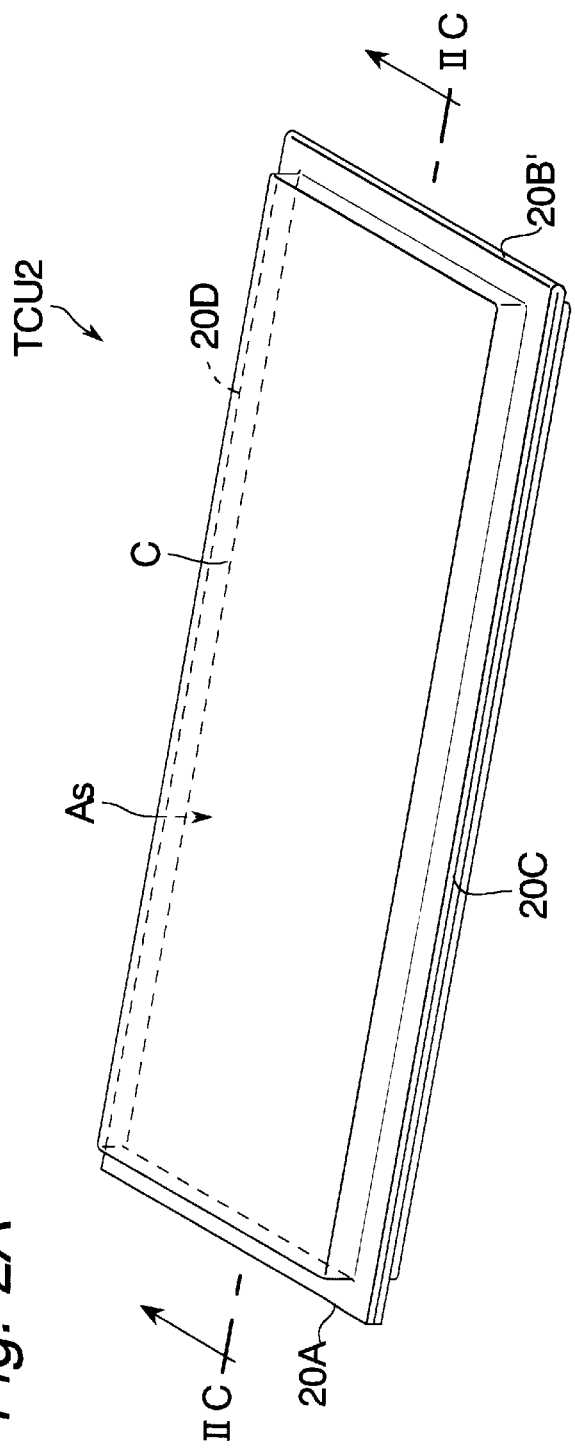
FIG. 2A is a perspective view showing a heat conducting unit of a second embodiment of the present invention.
Figure 2C:
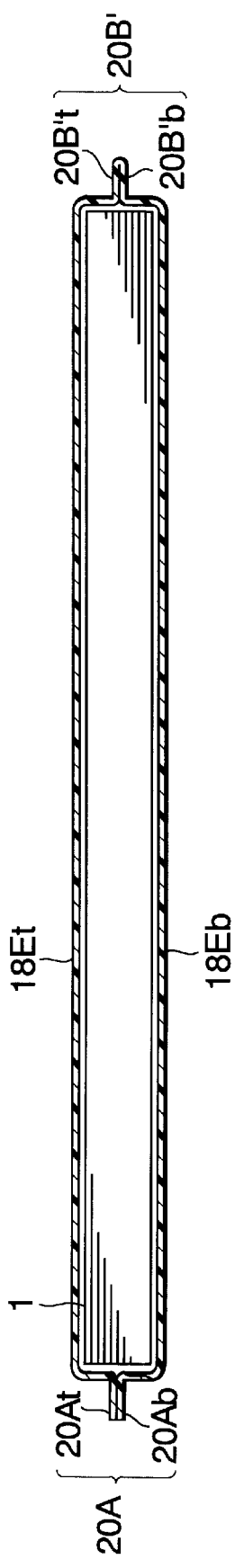
FIG. 2C shows the section IIC—IIC of the heat conducting unit shown in FIG. 2A.
Figure 2B:
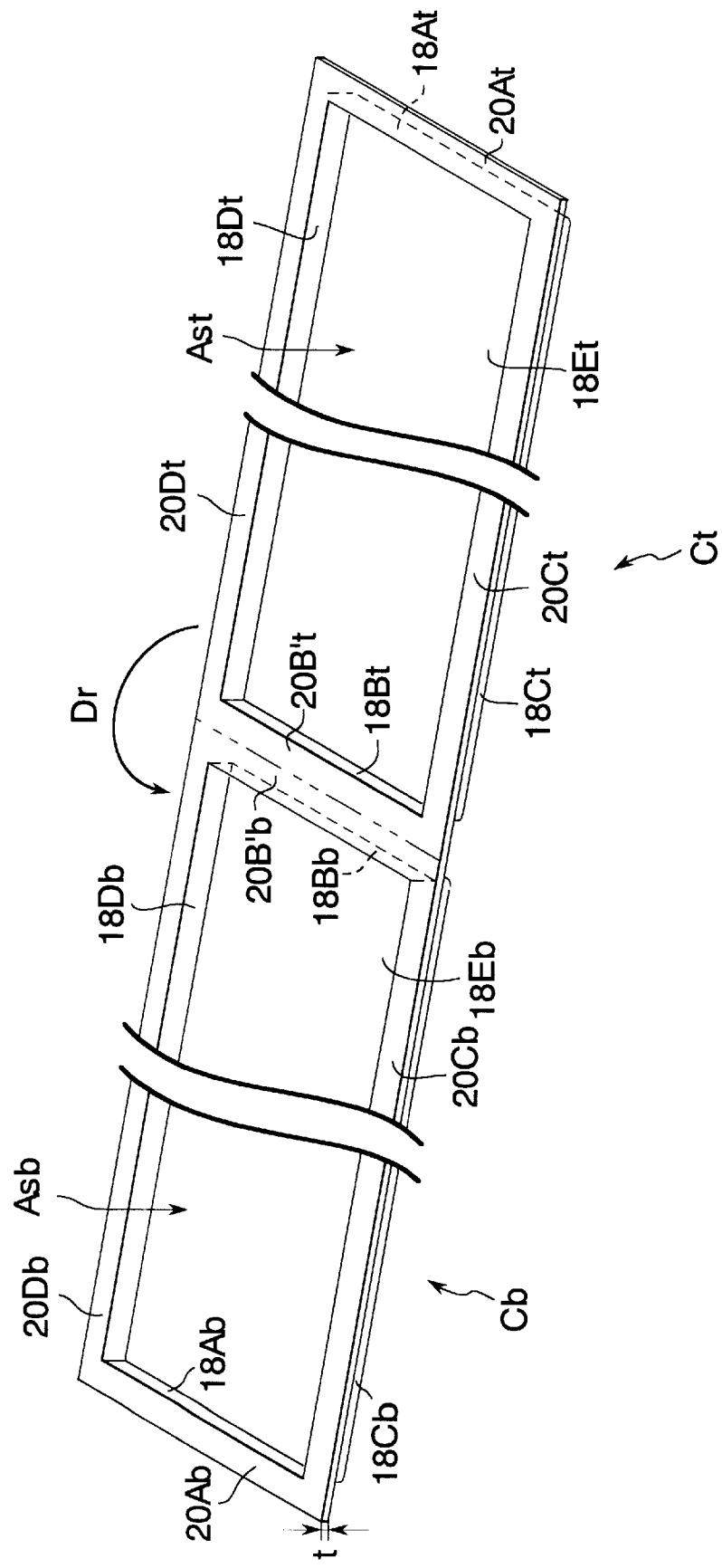
FIG. 2B is a developed view showing the structure of the container of the heat conducting unit shown in FIG. 2A.

Referring to FIGS. 2A, 2B, and 2C, a heat conducting unit of a second embodiment of the present invention will now be described.

As shown in the perspective view of FIG. 2A, a heat conducting unit TCU2 of this embodiment is the same as the heat conducting unit TCU1 of the first embodiment of the present invention described referring to FIGS. 1A, 1B, 1C and 1D, except that a rim section 20B' is substituted for the rim section 20B. Accordingly, for simplification, the features common to the heat conducting unit TCU1 and this unit are not described again.

In the heat conducting unit TCU2, as shown in FIG. 2B, the first case Cb and the second case Ct are integrally formed, with the rim 20B'b and the rim 20B't of the rim section 20B' abutting on their respective edges. The heat conducting unit TCU2 can be fabricated by putting a graphite sheet 1, a graphite sheet group GS, or a graphite block GB in the recessed part Asb of the first case Cb or the recessed part Ast of the second case Ct, turning the second case Ct in the direction of the arrow Dr about the rim section 20B' to lay the second case Ct on the first case Cb, and then joining the rim sections 20A, 20B', 20C, and 20D, similarly to that in the first embodiment.

FIG. 2C shows the section IIC—IIC of the heat conducting unit TCU2 shown in FIG. 2A. Similarly to the example shown in FIG. 1C, a graphite sheet group GS containing a given number of stacked graphite sheets 1 having flexibility and in substantially the same shape is accommodated in the space As of the container C. A graphite sheet block GB having equivalent shape may be used in place of the graphite sheet group GS. Needless to say, a graphite sheet group GS composed of graphite sheets 1 of different lengths as shown in FIG. 1D, or a graphite block GB of equivalent shape may be accommodated in the container C.

Figure 3B:
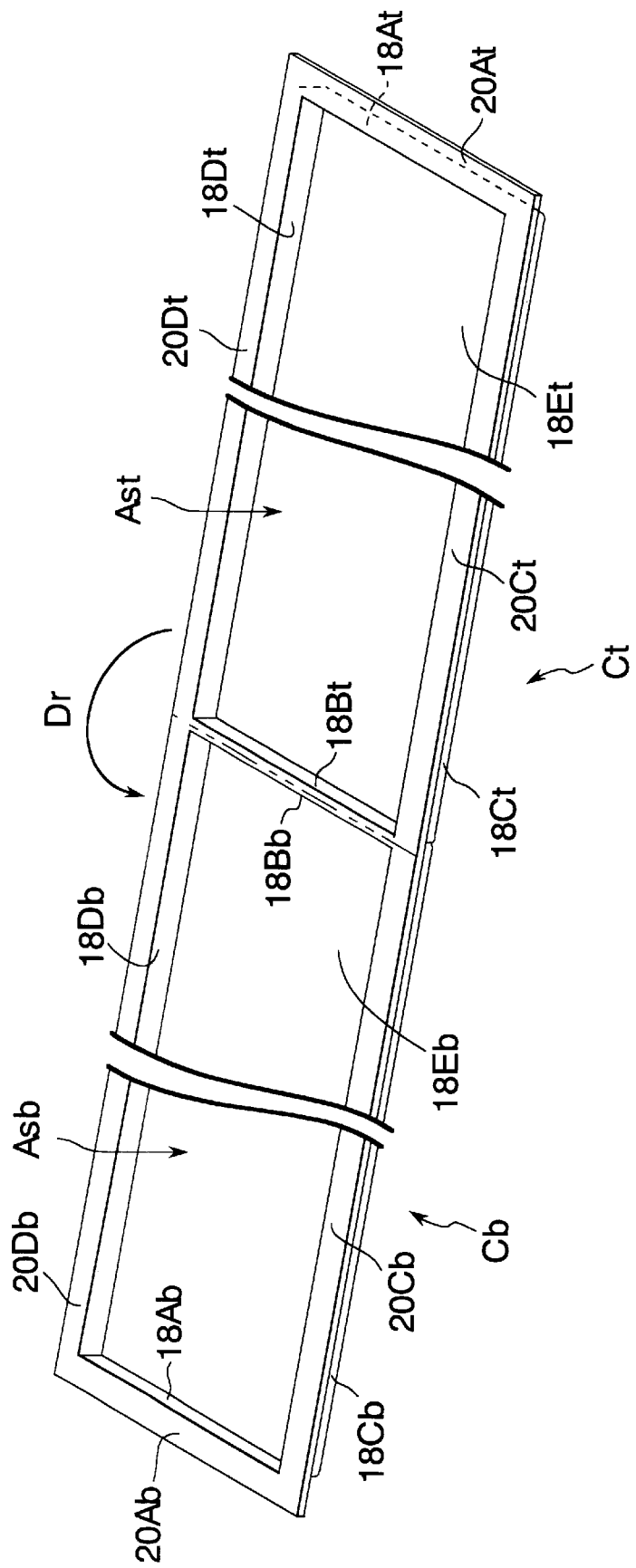
FIG. 3B is a developed view showing the structure of the container of the heat conducting unit shown in FIG. 3A.

Further, when fabricating the heat conducting unit TCU2 by putting the graphite sheet 1, the graphite sheet group GS, or the graphite block GB in the container C (the recessed part Asb and the recessed part Ast), the heat conducting unit TCU2 having the first case Cb and the second case Ct integrally prepared as shown in FIG. 3B does not encounter the failure that the fabrication must be stopped because of lack of the first case Cb or the second case Ct.

(Third Embodiment)

Now referring to FIGS. 3A, 3B, and 3C, a heat conducting unit of a third embodiment of the present invention will be described.

As shown in the perspective view of FIG. 3A, the heat conducting unit TCU3 of this embodiment is entirely the same as the heat conducting unit TCU2 of the second embodiment of the present invention which has been described referring to FIGS. 2A, 2B and 2C, except that it does not have the rim section 20B of the heat conducting unit TCU2. Accordingly, for simplification, features common to the heat conducting unit TCU2 and this unit will not be described again.

In the heat conducting unit TCU3, as shown in FIG. 3B, the first case Cb and the second case Ct have their respective side wall 18Bb and side wall 18Bt integrally formed along the upper edges. Similarly to the heat conducting unit TCU2, the heat conducting unit TCU3 can be fabricated by putting the graphite sheet 1, the graphite sheet group GS, or the graphite block GB in the recessed part Asb of the first case Cb and the recessed part Ast of the second case Ct, turning the second case Ct in the direction of the arrow Dr about the joined side of the side wall 18Bb and the side wall 18Bt to lay the second case Ct on the first case Cb, and then joining the rim sections 20A, 20C, and 20D.

FIG. 3C shows the section IIIC—IIIC of the heat conducting unit TCU3 shown in FIG. 3A. In this example, similarly to the example shown in FIG. 1C, a graphite sheet group GS in which a given number of graphite sheets 1 having flexibility and of substantially the same shape are stacked is accommodated in the space As of the container C, but a graphite sheet block GB of equivalent shape may be used in place of the graphite sheet group GS. A graphite sheet group GS composed of graphite sheets 1 of different lengths as shown in FIG. 1D, or a graphite block GB of equivalent shape may be accommodated in the container C.

For the heat conducting unit TCU3 of this embodiment, the requirements for the graphite and the high-molecular compound sheet are the same as those for the above-described heat conducting unit TCU2. The heat conducting unit TCU3 provides the same effects and features as those of the heat conducting units TCU1 and TCU2 of the first and second embodiments.

While the heat conducting unit TCU3 is similar to the heat conducting unit TCU2 in that the first case Cb and the second case Ct are integrally formed, it does not have the rim section (20B) on the side wall 18B, unlike the heat conducting unit TCU1 and heat conducting unit TCU2. Hence the side wall 18B can be in close contact with a heat generating part to increase the heat conducting efficiency without being interfered with by the rim section (20B). In this case, needless to say, it is preferred that the graphite sheet 1, the graphite sheet group GS, or the graphite block GB accommodated in the container C is set as close to the side wall 18B as possible, as shown in FIG. 3C.

(Modifications)

Referring to FIGS. 4A, 4B, 4C, and FIGS. 5A, 5B, 5C, applications of the above-described heat conducting units TCU of the present invention in transformed shapes will be described. Although the heat conducting unit TCU1 is shown by way of example in these diagrams, it is a matter of course that the heat conducting unit TCU2 and the heat conducting unit TCU3 can be used in the same way as the heat conducting unit TCU1.

Figure 4A:
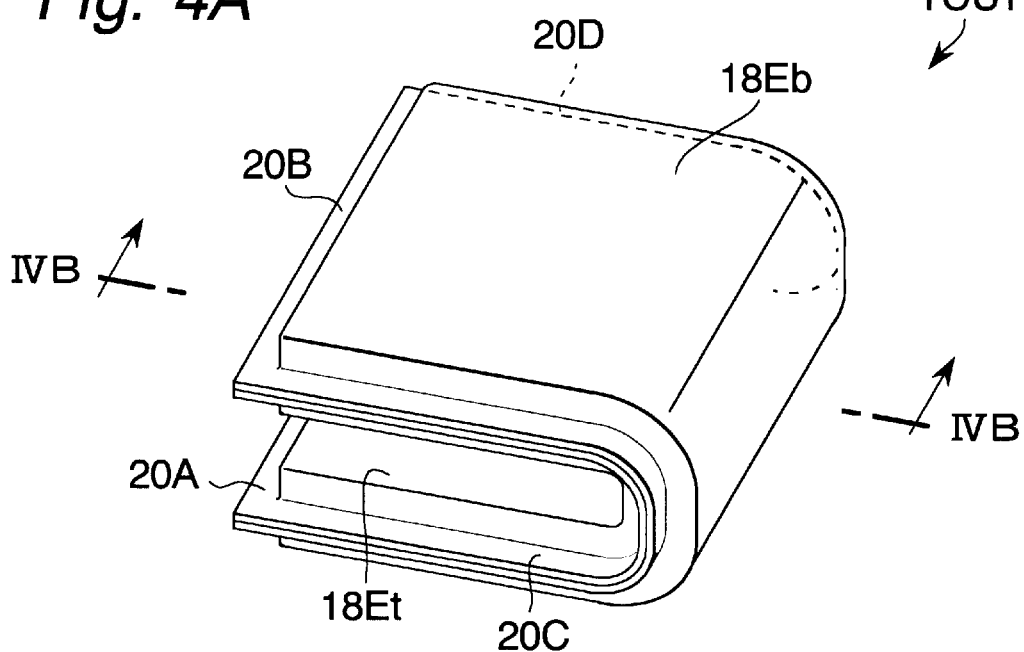
FIG. 4A is a perspective view showing a first modification of the heat conducting unit of the embodiments of the present invention.

First, referring to FIGS. 4A, 4B, and 4C, examples in which the heat conducting unit TCU is bent in one direction will be described. First, FIG. 4A shows the heat conducting unit TCU1 bent in the elongate direction. As shown in this diagram, the graphite sheet 1 or the graphite sheet group GS accommodated in the container C of the heat conducting unit TCU1 and the high-molecular compound sheet can be freely bent, since they have flexibility.

Figure 4B:
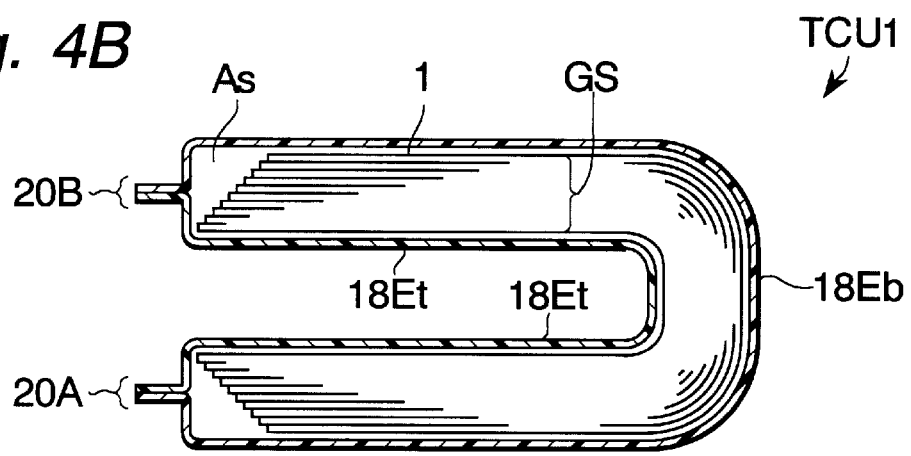
FIG. 4B shows the section IVB—IVB of the heat conducting unit shown in FIG. 4A.
Figure 4C:
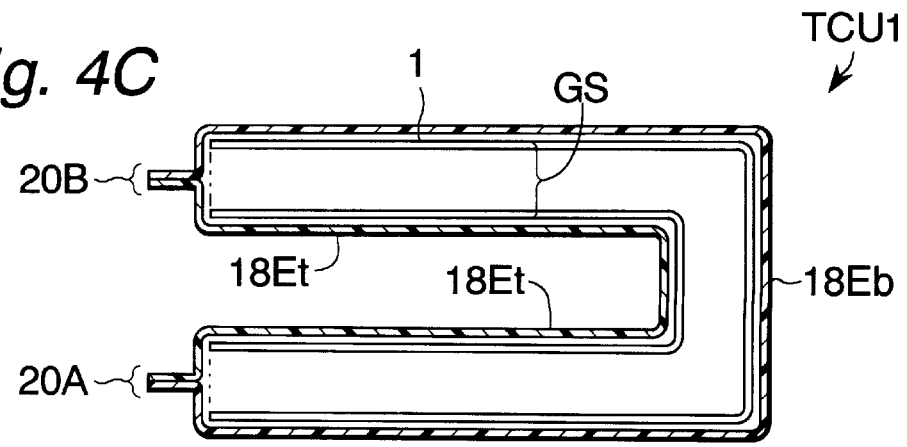
FIG. 4C is a sectional view showing another example of the heat conducting unit shown in FIG. 4B.

FIG. 4B shows the section IVB—IVB of the heat conducting unit TCU1 shown in FIG. 4A. This diagram shows the interior of the heat conducting unit TCU1 in an example in which the graphite sheets 1 have approximately the same shape as shown in FIG. 1C, more specifically, in an example in which they have approximately the same length in the bent direction. When the heat conducting unit TCU1 is bent, both edges of the graphite sheets 1 located in outer corner of the bend are positioned more distant from the rim section 20A and the rim section 20B than the graphite sheets 1 located in inner corner of the bend. As a result, gaps are formed as shown in the diagram between the side walls and the graphite sheet group GS.

Although FIG. 4B shows the gaps in an emphasized manner for clear understanding, they are small enough to be negligible in practice. However, when such gaps are undesirable for the shape of electronic equipment in which the heat conducting unit TCU is used, the formation of the gaps can be prevented by forming the graphite sheets 1 of the graphite sheet group GS in such a way that those located in outer corner of the bend are longer, as has been described referring to FIG. 1D. FIG. 4C shows the heat conducting unit TCU1 fabricated by bending a graphite sheet group GS containing graphite sheets 1 differing in lengths to fit the shape of the space of installation and then completely joining the rim section 20. In actual work, it is fabricated by joining three, for example, of the four rim sections 20A, 20B, 20C, and 20D, with the graphite sheet group GS accommodated in the container C, shaping the heat conducting unit TCU to fit the space of installation, and then joining the remaining one rim section 20. In this embodiment, the graphite sheets are sized not so that the longest graphite sheet 1 can be accommodated in the container C, as shown in FIG. 1D, but so that the shortest graphite sheet 1 has the same length as the space As in the container C.

Needless to say, while this embodiment has shown an example in which it is bent once in the elongate direction, it can be bent not only in the elongate direction but also in arbitrary direction; the number of times that it is bent is not limited to once.

Further, the heat conducting unit TCU may be shaped in arbitrary bag-like shape, instead of the rectangular shape. Needless to say, when it is formed in a bag-like shape, the rim section 20 continuously extends to the top wall 18E*t* and the bottom wall 18E*b*, without the side wall 18. The heat conducting unit TCU may be formed only with the rim section 20A, with the three of the four rim sections 20 omitted, for example. Further, the container C may be formed as a bag composed of a high-molecular compound sheet, with the rim sections 20 all omitted.

Figure 5A:
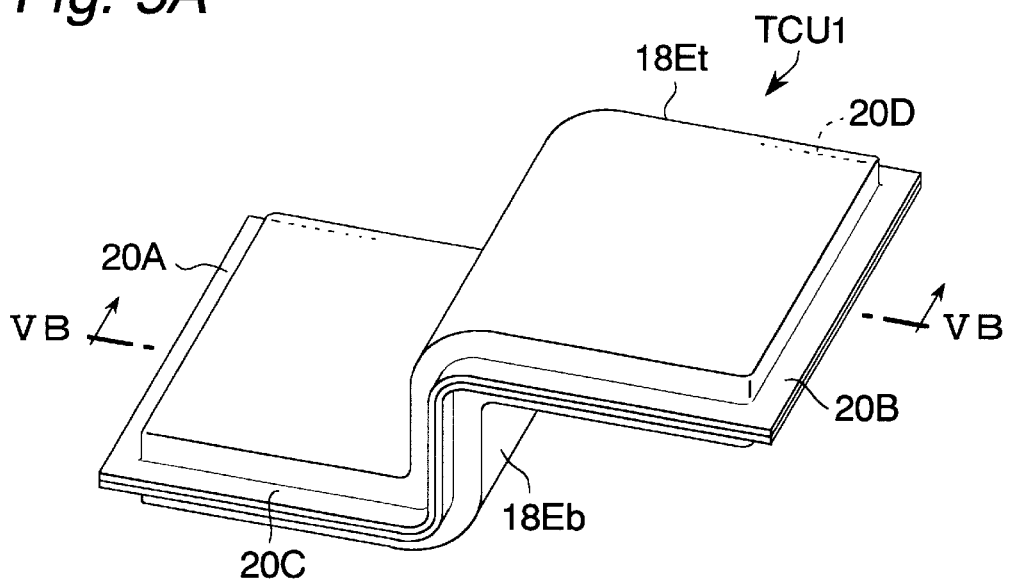
FIG. 5A is a perspective view showing a second modification of the heat conducting unit of the embodiments of the present invention.
Figure 5B:
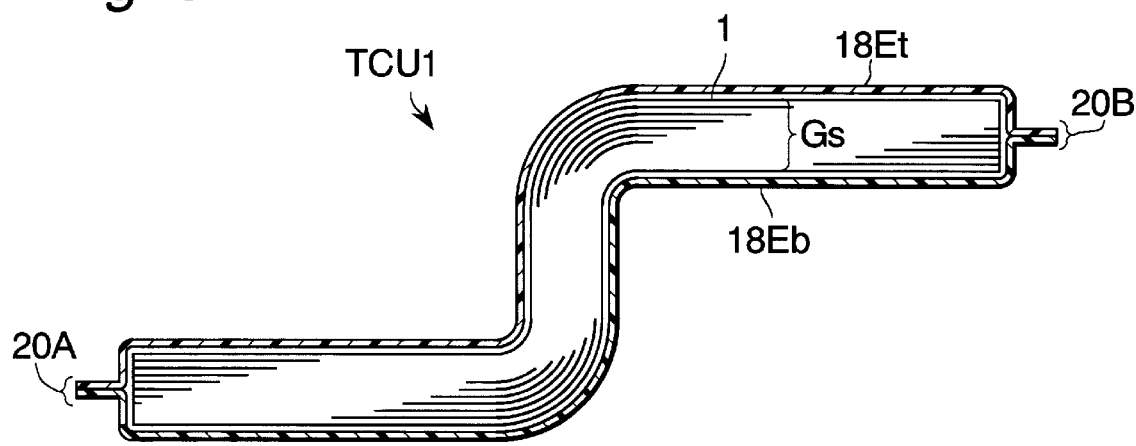
FIG. 5B shows the section VB—VB of the heat conducting unit shown in FIG. 5A.
Figure 5C:
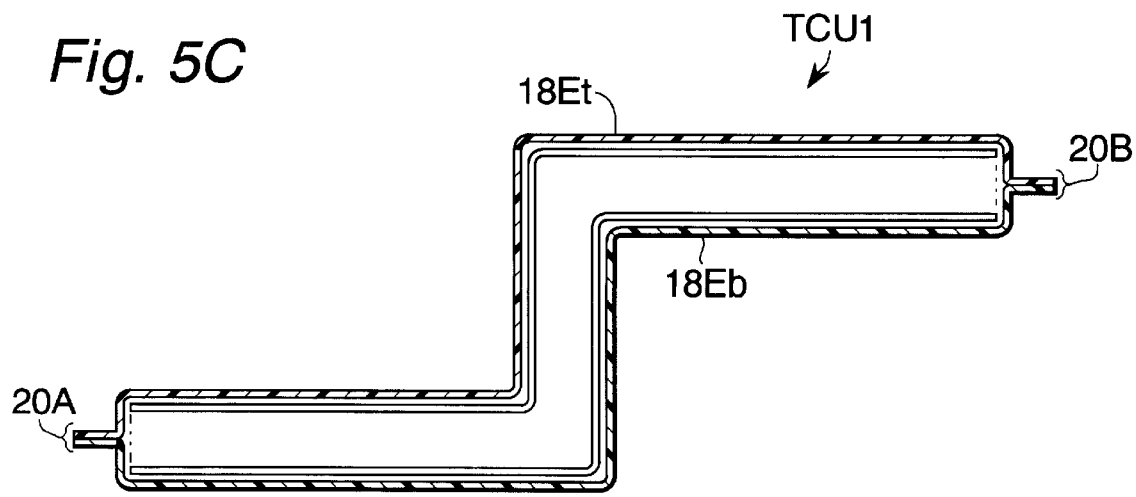
FIG. 5C is a sectional view showing another example of the heat conducting unit shown in FIG. 5B.

Next, referring to FIGS. 5A, 5B, and 5C, examples in which the heat conducting unit TCU is bent twice in one direction will be briefly described. FIG. 5A shows the heat conducting unit TCU1 bent in the elongate direction. FIG. 5B shows the section VB—VB of the heat conducting unit TCU1 shown in FIG. 5A. While FIG. 5C is similar to FIG. 5B, it shows an example in which the heat conducting unit TCU is forced into a shape fitting the surrounding space. While the graphite sheet 1, the graphite sheet group GS, or the graphite block GB accommodated in the container C is set to form smaller gaps with the side walls in FIGS. 5B and 5C, it may be set so that the gaps become larger as it is bent, as shown in FIG. 4B.

The heat conducting units TCU having the shapes shown in the modifications can be produced mainly by the following three methods:

1. As shown in the embodiments above, a heat conducting unit TCU having graphite sheets 1 linearly formed and not bonded to each other is bent into desired shape.

2. Graphite sheets 1 formed in a desired shape in advance are bonded with an adhesive to each other and shaped into the graphite sheet group GS, and then it is covered in a high-molecular compound sheet, thus providing a heat conducting unit TCU of desired shape.

3. A graphite block GB formed in a desired shape is covered in a high-molecular compound sheet to obtain a heat conducting unit TCU of desired shape.

As described above, the heat conducting unit TCU containing the graphite sheets 1 to graphite sheet group GS can be shaped in accordance with the shape of the space in electronic equipment, which facilitates assembly of the electronic equipment. Further, when the heat conducting unit TCU is processed into desired shape in advance, the electronic equipment can be fabricated easily.

(Fourth Embodiment)

Figure 6:
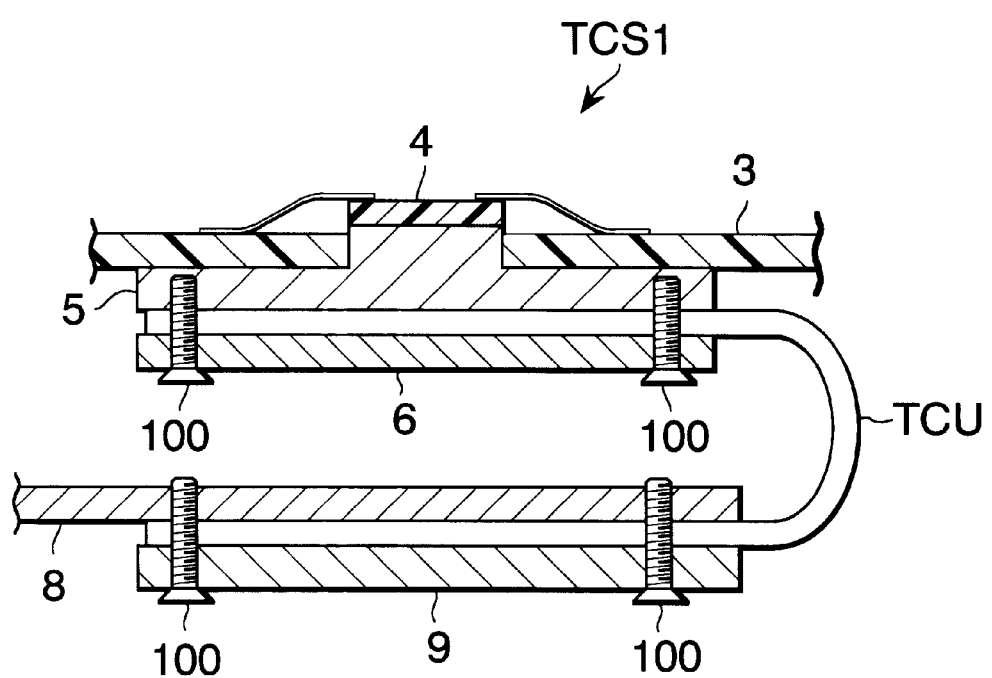
FIG. 6 is a main section view showing a heat connecting structure of a fourth embodiment of the present invention.

An embodiment of a heat connecting structure will now be described referring to the main section view of FIG. 6, in which a heat generator and a heat radiator are connected through the heat conducting unit TCU of the present invention.

In the heat generating part, the heat connecting structure TCS1 of the present invention includes a circuit board 3, a bare chip 4 of CPU of a tape carrier package TCP, a heatsink 5, a flat plate 6, and the heat conducting unit TCU. The bare chip 4 of the CPU 4 of TCP is mounted on the circuit board 3, and the circuit board 3 is holed in the part right under the CPU 4. The heatsink 5 is bonded directly on the CPU 4, and the heatsink 5 made of aluminum and the flat plate 6 made of aluminum are fastened and fixed with screws 100, with one end of the heat conducting unit TCU of the present invention sandwiched between the heatsink 5 and the flat plate 6.

On the other end or in the heat dissipating part of the heat connecting structure TCS1, a large-area aluminum radiation board 8 and an aluminum flat plate 9 are fastened and fixed with screws 100, with the heat conducting unit TCU sandwiched between the radiation board 8 and the flat plate 9.

The flat plate 6 and the flat plate 9 are used for the purpose of certainly keeping the heat conducting unit TCU and the heatsink 5, or the heat conducting unit TCU and the radiation board 8 in surface contact; flat plates made of material other than metal, such as resin material, may be used in place of the metal plates. In the heat connecting structure in the heat dissipating part, a heat conductor having a flat plane, such as a metal frame made of a magnesium alloy, may be used in place of the large-area aluminum radiation board 8.

The heat conducting unit TCU made of a flexible material is pressurized so that the individual graphite sheets, the graphite sheets and the high-molecular compound sheet, and the high-molecular compound sheet and the heat conductors (the heatsink 5, radiation board 8) come in close contact more tightly, to increase the heat conducting efficiency. This is effective especially when the graphite sheets are not bonded to each other, or when the graphite sheets and the high-molecular compound sheet are not bonded.

While the heat conducting unit TCU is fastened with screws to obtain closer contact in this example, it may be pressed with springs, or elastic material, to obtain tighter fixing and closer contact.

This structure efficiently transfers heat from the CPU 4 to the radiation board 8.

(Fifth Embodiment)

Figure 7:
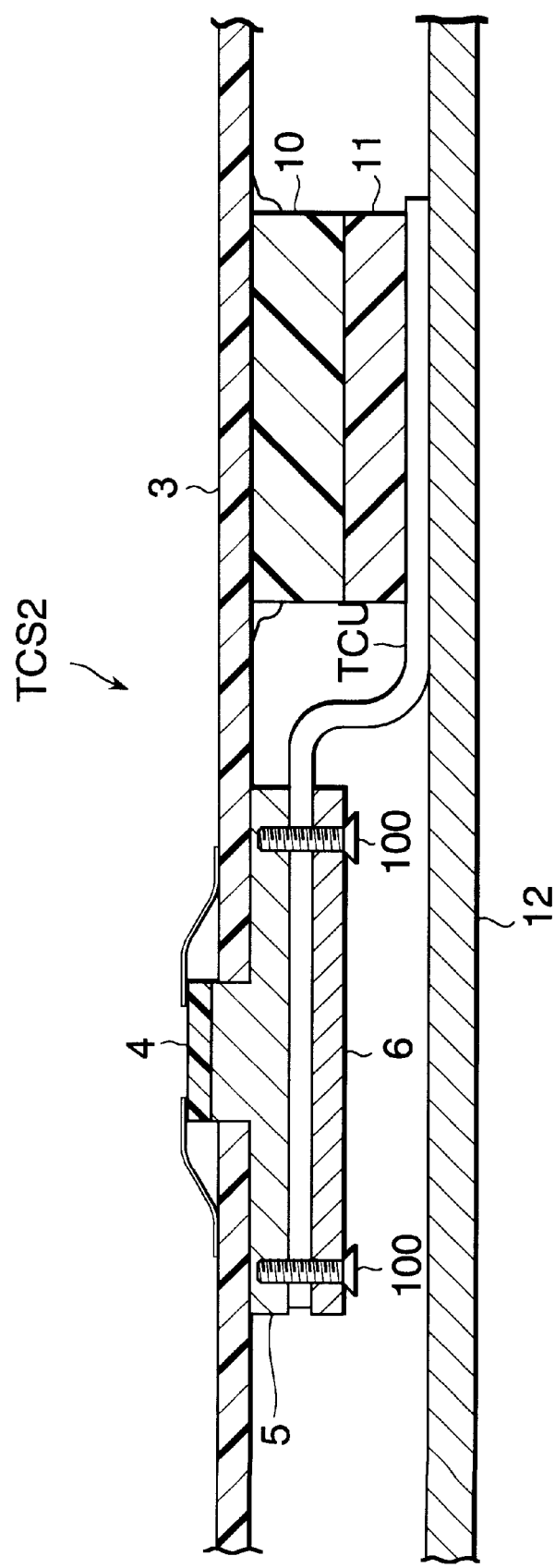
FIG. 7 is a main section view showing a heat connecting structure of a fifth embodiment of the present invention.

Referring to the main section view shown in FIG. 7, another embodiment of the heat connecting structure TCS of the present invention will be described. In the heat connecting structure TCS2 of this embodiment, the circuit board 3, the CPU 4, the heatsink 5, and the heat conducting unit TCU in the heat generating part are the same as those in the heat connecting structure TCS1 shown in FIG. 6.

In the heat dissipating part of the heat connecting structure TCS2, a plate-like sol foamed soft sheet 11 is fixed on the circuit component 10 on the circuit board 3, and the heat conducting unit TCU is sandwiched between the metal frame 12 made of a magnesium alloy and the plate-like sol foamed soft sheet 11 so that the heat conducting unit TCU is pressed against the magnesium-alloy metal frame 12 by the elasticity of the plate-like sol foamed soft sheet 11.

While the plate-like sol foamed soft sheet 11 is fixed on the circuit component 10 in this example, the plate-like sol foamed soft sheet 11 may be fixed directly onto the circuit board 3. With this structure, a heat dissipating measure can be completed only by fabricating the heat radiating parts on the substrate side and incorporating this substrate into the frame, thus reducing the number of assembly steps.

(Sixth Embodiment)

Figure 8:
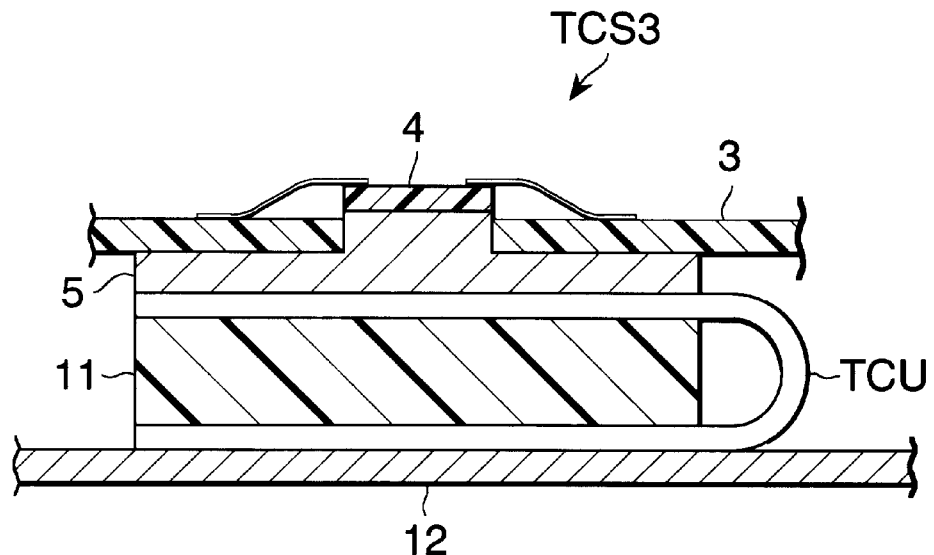
FIG. 8 is a main section view showing a heat connecting structure of a sixth embodiment of the present invention.

Referring to the main section view shown in FIG. 8, still another embodiment of the heat connecting structure TCS of the present invention will be described. In the heat connecting structure TCS3 of this embodiment, the circuit board 3, the CPU 4, the heatsink 5, the heat conducting unit TCU, and the structure for connecting heat in the heat generating part are the same as those in the heat connecting structure TCS1 shown in FIG. 6. In the structure for connecting heat in the heat generating part, the heat conducting unit TCU is sandwiched between the heatsink 5 and the plate-like sol foamed soft sheet 11 and pressed on the heatsink 5 by utilizing the elasticity of the plate-like sol foamed soft sheet 11.

In the structure for connecting heat in the heat dissipating part of the heat connecting structure TCS3, the heat conducting unit TCU is sandwiched between the magnesium-alloy metal frame 12 and the plate-like sol foamed soft sheet 11 and thus pressed against over the metal frame 12 by utilizing the elasticity of the plate-like sol foamed soft sheet 11.

With this structure, the plate-like sol foamed soft sheet 11 simultaneously presses the heat conducting unit TCU in both of the heat generating and heat dissipating parts, which reduces the number of parts and the number of assembly steps.

(Seventh Embodiment)

Figure 9:
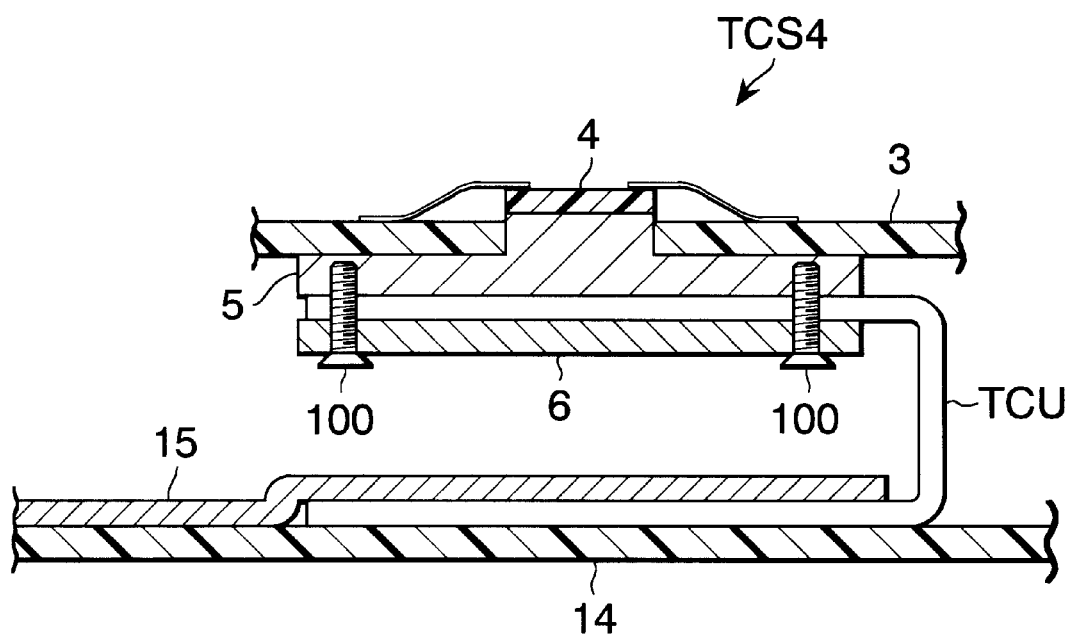
FIG. 9 is a main section view showing a heat connecting structure of a seventh embodiment of the present invention.

Referring to FIG. 9, a further embodiment of the heat connecting structure TCS of the present invention will be described. In the heat connecting structure TCS4 of this embodiment, the circuit board 3, the CPU 4, the heatsink 5, the flat plate 6, the heat conducting unit TCU, and the structure for thermal connection are the same as those in the heat connecting structure TCS1 shown in FIG. 6.

In the heat dissipating part of the heat connecting structure TCS4, the heat conducting unit TCU is sandwiched between a resin frame 14 of the electronic apparatus and a radiation board 15 stuck on the bottom wall of the resin frame, and the radiation board 15 and the frame 14 are fixed by thermal compression bonding. This structure reduces the number of parts and the number of assembly steps.

(Eighth Embodiment)

Figure 10A:
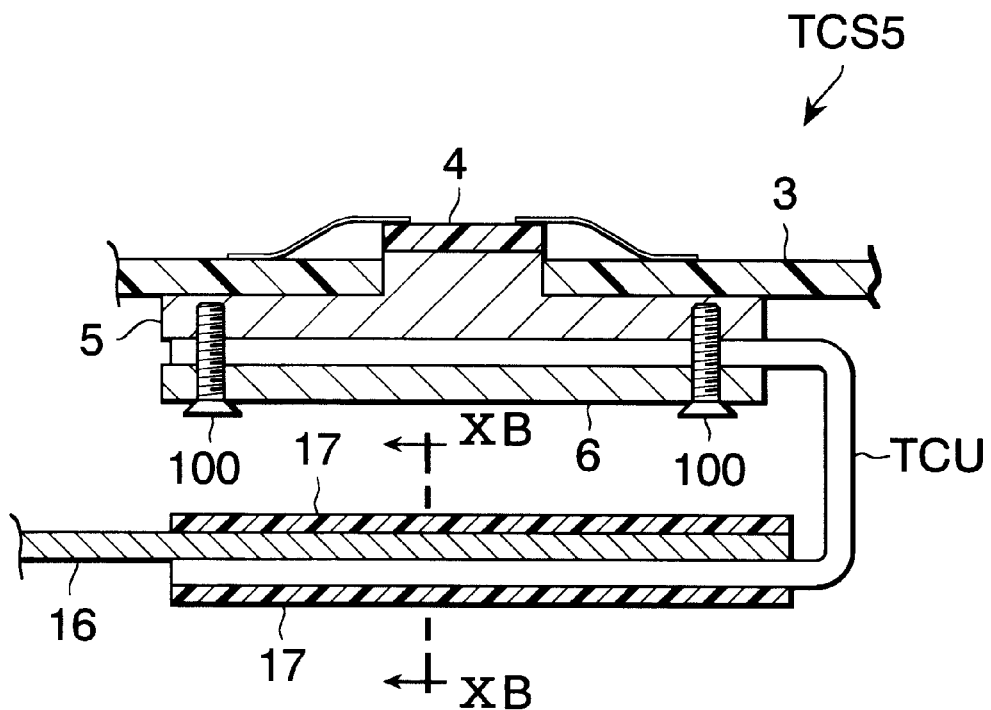
FIG. 10A is a main section view showing a heat connecting structure of an eighth embodiment of the present invention.
Figure 10B:
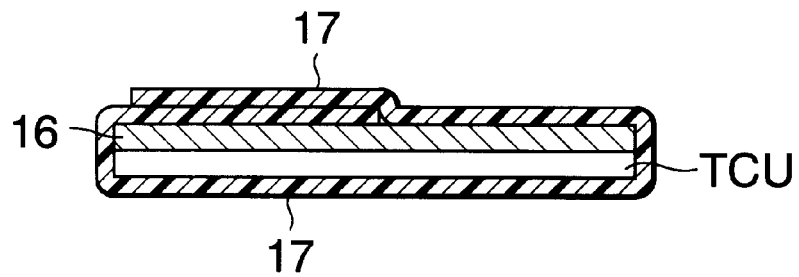
FIG. 10B is the sectional view taken along the line XB—XB of the heat connecting structure shown in FIG. 10A.

Referring to FIG. 10A and FIG. 10B, still another embodiment of the heat connecting structure TCS of the present invention will be described. FIG. 10A shows a section of the main part of a heat connecting structure TCS5 of this embodiment, and FIG. 10B shows the section XB—XB shown in FIG. 1A. In the heat connecting structure TCS5, the circuit board 3, the CPU 4, the heatsink 5, the flat plate 6, the heat conducting unit TCU, and the structure for thermal connection are the same as those of the heat connecting structure TCS1 shown in FIG. 6.

As shown in FIG. 10B, in the heat dissipating part of the heat connecting structure TCS5, one end of the heat conducting unit TCU is pressed against a large-area radiation board 16 and wound and fixed with adhesive tape 17. This structure efficiently transfers heat from the CPU 4 to the radiation board 16. A heat-shrinkable tube may be used instead of the adhesive tape. The simple structure of the thermal connector enables reduction in the number of assembly steps and reduction in material cost.

(Ninth Embodiment)

Figure 11:
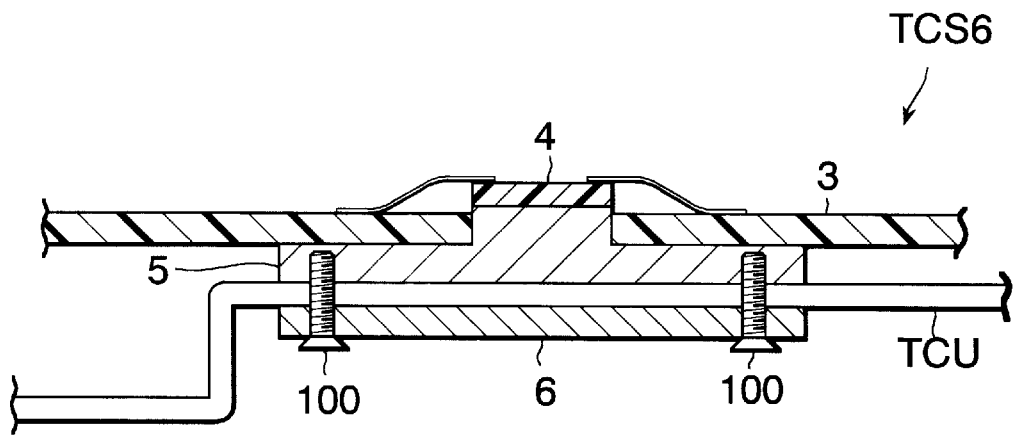
FIG. 11 is a main section view showing a heat connecting structure of a ninth embodiment of the present invention.

Referring to FIG. 11, a further embodiment of the heat connecting structure TCS of the present invention will be described. In the heat connecting structure TCS6 of this embodiment, the circuit board 3, the CPU 4, the heatsink 5, the flat plate 6, and the heat conducting unit TCU are the same as those in the heat connecting structure TCS1 shown in FIG. 6.

The heat connecting structure of this embodiment is realized by fastening the heatsink 5 and the flat plate 6 with screws, with part of the heat conducting unit TCU sandwiched between the heatsink 5 and the flat plate 6. The two ends of the heat conducting unit TCU are extended to given positions not shown and function as a heat dissipating part.

With this structure, heat from the CPU 4 is conducted to the heat conducting unit TCU, and both ends of the heat conducting unit TCU are used as a heat dissipating part. Since the heat conducting unit TCU has much higher thermal conductivity than copper and aluminum and smaller specific gravity as stated above, it is possible to realize a heat connecting structure with smaller heat dissipating area and lighter weight as compared with conventional heat radiating structures.

(Tenth Embodiment)

Figure 12:
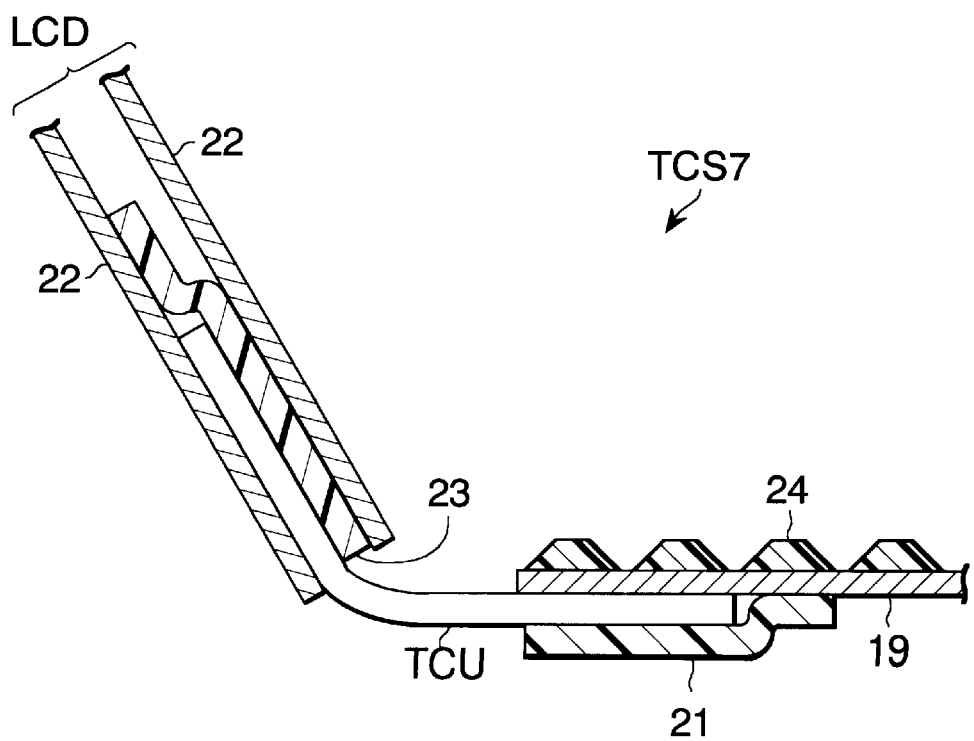
FIG. 12 is a main section view showing a heat connecting structure of a tenth embodiment of the present invention.

Referring to FIG. 12, still another embodiment of the heat connecting structure TCS of the present invention will now be described. In the heat connecting structure TCS7 of this embodiment, one end of the heat conducting unit TCU is pressed against the back plate 19 of keyboard and stuck and fixed with adhesive tape 21. Heat from the highly heat generating CPU (not shown) is directly transferred to the back plate 19 of the keyboard, as a heat generating part. The other end of the heat conducting unit TCU is pressed against the metal body 22 of the LCD unit, and stuck and fixed with adhesive tape 21.

With this structure, heat in the back plate 19 of the keyboard escapes to the metal frame 22 of the LCD unit. The heat conducting unit TCU having flexibility can be used in movable part for rotatively fixing the LCD unit to the main body in a notebook-sized personal computer, for example.

With the heat conducting units of the present invention, graphite sheets with high thermal conductivity are covered by a sheet-like high-molecular compound, which reduces thermal resistance of the entire heat conducting unit while keeping the tensile strength and peeling strength over the practical level.

When the heat generating part includes a main component such as a CPU or an HDD, the use of the flexible graphite sheets prevents vibration transferred to the heat dissipating part from being further transferred to the heat generating part, which prevents the trouble of damaging the main component like a CPU or an HDD.

The heat conducting unit is fabricated by previously processing graphite sheets into desired shape (for example, final shape in which the heat conducting unit is incorporated into an electronic apparatus), or forming a graphite block into desired shape, and then covering it with said sheet-like high-molecular compound, which considerably facilitates assembly of the electronic apparatus, without the need of bending the heat conducting unit in assembly.

In the heat connecting structure of the present invention, a heat generating part and the heat conducting unit of the present invention or a heat dissipating part and the heat conducting unit of the present invention are connected by sandwiching it with metal or resin or by covering it with adhesive tape, which reduces connective thermal resistance between the heat generating part and the heat conducting unit of the present invention and the connective thermal resistance between the heat dissipating part and the heat conducting unit of the present invention. As a result, the area of the heat dissipating part can be reduced, leading to weight and size reduction of the electronic apparatus.

When the heat conducting unit of the present invention is utilized as a heat dissipating part, the heat conducting unit of the present invention having higher thermal conductivity than copper and aluminum allows reduction in heat dissipating area and reduction in weight, as compared with radiation boards of such materials.

INDUSTRIAL APPLICABILITY

In electronic apparatuses like portable information processing devices very highly integrated for size reduction and weight reduction, such as notebook-sized personal computers, portable information terminals, the present invention can be used in a heat conducting cooling system for cooling the interior of the electronic apparatus by efficiently transferring heat generated in the electronic apparatus to a lower-temperature part.

What is claimed is:

1. A heat conducting unit for use with a high temperature part and a low temperature part, and for use in transferring heat generated in the high temperature part to the low temperature part via a heat path, said heat conducting unit comprising:

a container composed of a flexible sheet; and at least one flexible graphite sheet, capable of being shaped in accordance with the heat path, located in said container and thermally connected to said flexible sheet of said container;

wherein said at least one graphite sheet is to be thermally connected to the high temperature part and the low temperature part via said flexible sheet and is to be shaped in accordance with the heat path;

wherein said flexible sheet is composed of a high-molecular compound; and wherein said high-molecular compound is polyester having a thickness of 20 to 30 $\mu$m.

* * * * *